(12) United States Patent
Huang

(10) Patent No.: US 7,834,400 B2
(45) Date of Patent: Nov. 16, 2010

(54) SEMICONDUCTOR STRUCTURE FOR PROTECTING AN INTERNAL INTEGRATED CIRCUIT AND METHOD FOR MANUFACTURING THE SAME

(75) Inventor: Chih-Feng Huang, Jhubei (TW)

(73) Assignee: System General Corp., Taipei (TW)

( * ) Notice: Subject to any disclaimer, the term of this patent is extended or adjusted under 35 U.S.C. 154(b) by 381 days.

(21) Appl. No.: 11/798,212

(22) Filed: May 11, 2007

(65) Prior Publication Data

US 2008/0277728 A1 Nov. 13, 2008

(51) Int. Cl.
  *H01L 23/62* (2006.01)
(52) U.S. Cl. ............................... 257/355; 257/E29.181; 438/133
(58) Field of Classification Search ................. 257/355, 257/E29.181; 438/133
  See application file for complete search history.

(56) References Cited

U.S. PATENT DOCUMENTS

| | | | | |
|---|---|---|---|---|
| 4,626,882 A | * | 12/1986 | Cottrell et al. | 257/357 |
| 5,519,243 A | * | 5/1996 | Kikuda et al. | 257/371 |
| 6,268,992 B1 | * | 7/2001 | Lee et al. | 361/111 |
| 2004/0164356 A1 | * | 8/2004 | Josef Mergens et al. | 257/360 |

* cited by examiner

*Primary Examiner*—Thao X Le
*Assistant Examiner*—Matthew Gordon
(74) *Attorney, Agent, or Firm*—Bacon & Thomas, PLLC

(57) ABSTRACT

A semiconductor structure for protecting an internal integrated circuit comprises a substrate; a plurality of first doping regions formed in the substrate and disposed substantially within an N-well; a plurality of second doping regions, formed in the substrate and disposed within an P-well; a N+ section, formed in the substrate and enclosing the N-well and the P-well; a pad, formed above the substrate and electrically connected to at least one of the first doping regions; and a first ground and a second ground respectively disposed to positions corresponding to outside and inside of the N+ section. Also, the second doping regions are isolated from the first doping regions. The first and second doping regions located within the N+ section are isolated from the substrate by the N+ section. Furthermore, the second ground is electrically connected to at least one of the second doping regions.

13 Claims, 6 Drawing Sheets

SEMICONDUCTOR STRUCTURE FOR PROTECTING AN INTERNAL INTEGRATED CIRCUIT AND METHOD FOR MANUFACTURING THE SAME

BACKGROUND OF THE INVENTION

1. Field of the Invention

The invention relates in general to a semiconductor structure and method for manufacturing the same, and more particularly to a SCR (silicon controlled rectifier) electrostatic discharge (ESD) structure for protecting an internal integrated circuit and method for manufacturing the same.

2. Description of the Related Art

Electrostatic Discharge (ESD) Protection devices have been widely used in CMOS circuits to protect the internal circuit from damage due to the electrostatic discharge. FIG. 1 is a cross-sectional view of a conventional ESD protection device, which is formed by P+/N-well junction. Also, FIG. 1 shows a basic ESD device demonstrated by a diode. The diode is disposed between the pad and the internal circuit to prevent the internal circuit from the damage caused by the electrostatic discharge flowing through the pad to the internal circuit. The P+/N-well junction forms a diode and is disposed between the pad and the internal circuit. The internal circuit, for example, can be a VLSI (very large scale integration) circuit. The P+/N-well junction is usually used as a ESD protection device in the integrated circuit (IC) manufactured by CMOS (complementary metal-oxide-semiconductor) process. As shown in FIG. 1, the semiconductor structure for protecting an internal integrated circuit includes a P-type substrate (doped with P-type ions) 100, a N-well 110 formed in the P type substrate 100, a P+ doping region 116 connected to the pad in the N-well 110 to form a ESD protection device, a diode 112, and a N+ doping region 114 in the N-well 110 connected to the voltage source (Vcc). Moreover, a P+ doping region 116 in the P-type substrate 100 is connected to the ground. The conventional ESD protection device is usually disposed between the internal circuit and pad for protecting the internal circuit from burning due to the electrostatic discharge damage.

However, the ESD protection device is not suitable to be applied in high voltage CMOS process due to the propagation characteristics of conducting wire and a large dimension of general ESD devices. The current flowing through the ESD devices is not uniform, which may affect the electrical characteristics, such as breakdown voltage, of the ESD device. Besides, in high voltage CMOS process, the diode ESD device usually accompanies with one ground which also shares the same ground with the internal circuit. The high voltage ESD device may suffer high voltage such as 400 volts; thus, if the ground of the ESD device shares with the low voltage (such as 5 volts) internal circuit, the electrical characteristics of the internal circuit may be affected due to the ground not be fixed at zero volts, especially when the internal circuit is an analog integrated circuit.

SUMMARY OF THE INVENTION

It is therefore an object of the present invention to provide a semiconductor structure for protecting an internal integrated circuit, which can be disposed directly under the pad to reduce the chip die area. The semiconductor structure also comprises two grounds which can be independently connected to the different circuits. Furthermore, a method for manufacturing the structure is also presented.

In one embodiment, the invention achieves the above-identified object by providing a semiconductor structure for protecting an internal integrated circuit, comprising:

a substrate;

a plurality of first doping regions, formed in the substrate and disposed substantially within an N-well;

a plurality of second doping regions, formed in the substrate and disposed within an P-well, the second doping regions being isolated from the first doping regions;

a N+ section, formed in the substrate and enclosing the N-well and the P-well, wherein the first and second doping regions located within the N+ section are isolated from the substrate by the N+ section;

a pad, formed above the substrate and electrically connected to at least one of the first doping regions; and a first ground and a second ground, respectively disposed to positions corresponding to outside and inside of the N+ section, and the second ground electrically connected to at least one of the second doping regions.

The invention achieves the above-identified object by providing a method for manufacturing a semiconductor structure for protecting an internal integrated circuit, comprising:

providing a substrate;

forming a N+ section in the substrate;

forming a N-well and a P-well, wherein the step of forming a N+ section is performed before enclosing the N-well and the P-well;

forming a plurality of first doping regions substantially within the N-well in the substrate;

forming a pad above the substrate, and the pad electrically connected to at least one of the first doping regions; and disposing a first ground and a second ground at positions respectively corresponding to outside and inside of the N+ section, and the second ground being electrically connected to at least one of the second doping regions.

Other objects, features, and advantages of the present invention will become apparent from the following detailed description of the preferred but non-limiting embodiments. The following description is made with reference to the accompanying drawings.

DETAILED DESCRIPTION OF THE INVENTION

In the present invention, two embodiments are provided for demonstrating a semiconductor structure for protecting an internal integrated circuit. However, those embodiments disclosed herein are used for illustrating the invention, but not for limiting the scope of the invention.

Moreover, the basic techniques, such as formation of P well, N well deep N well and N-type buried layer etc., are known by one who is skilled in the field of the invention and won't be illustrated in detail. Additionally, the drawings used for illustrating the embodiments and applications of the present invention only show the major characteristic parts in order to avoid obscuring the present invention. Accordingly, the specification and the drawings are to be regard as an illustrative sense rather than a restrictive sense.

First Embodiment

Figure 1:
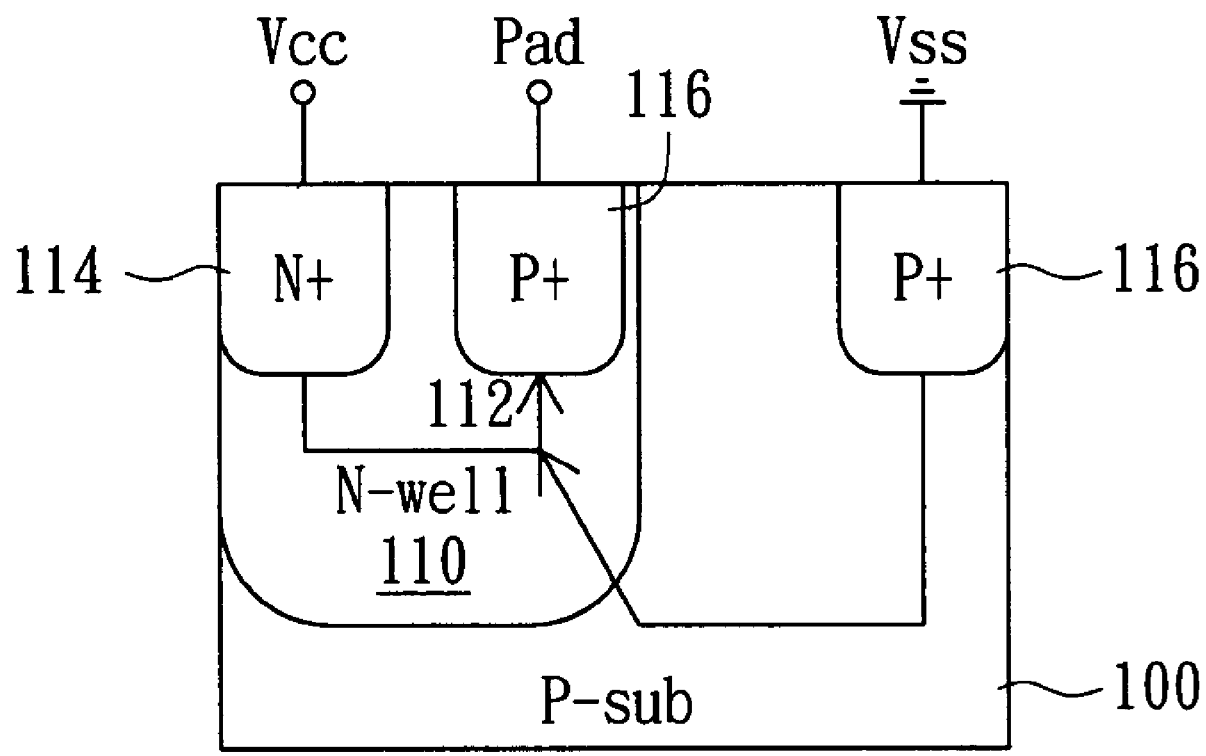
FIG. 1 (Prior Art) is a cross-sectional view of a conventional ESD protection device which is formed by P+/N-well junction.
Figure 2:
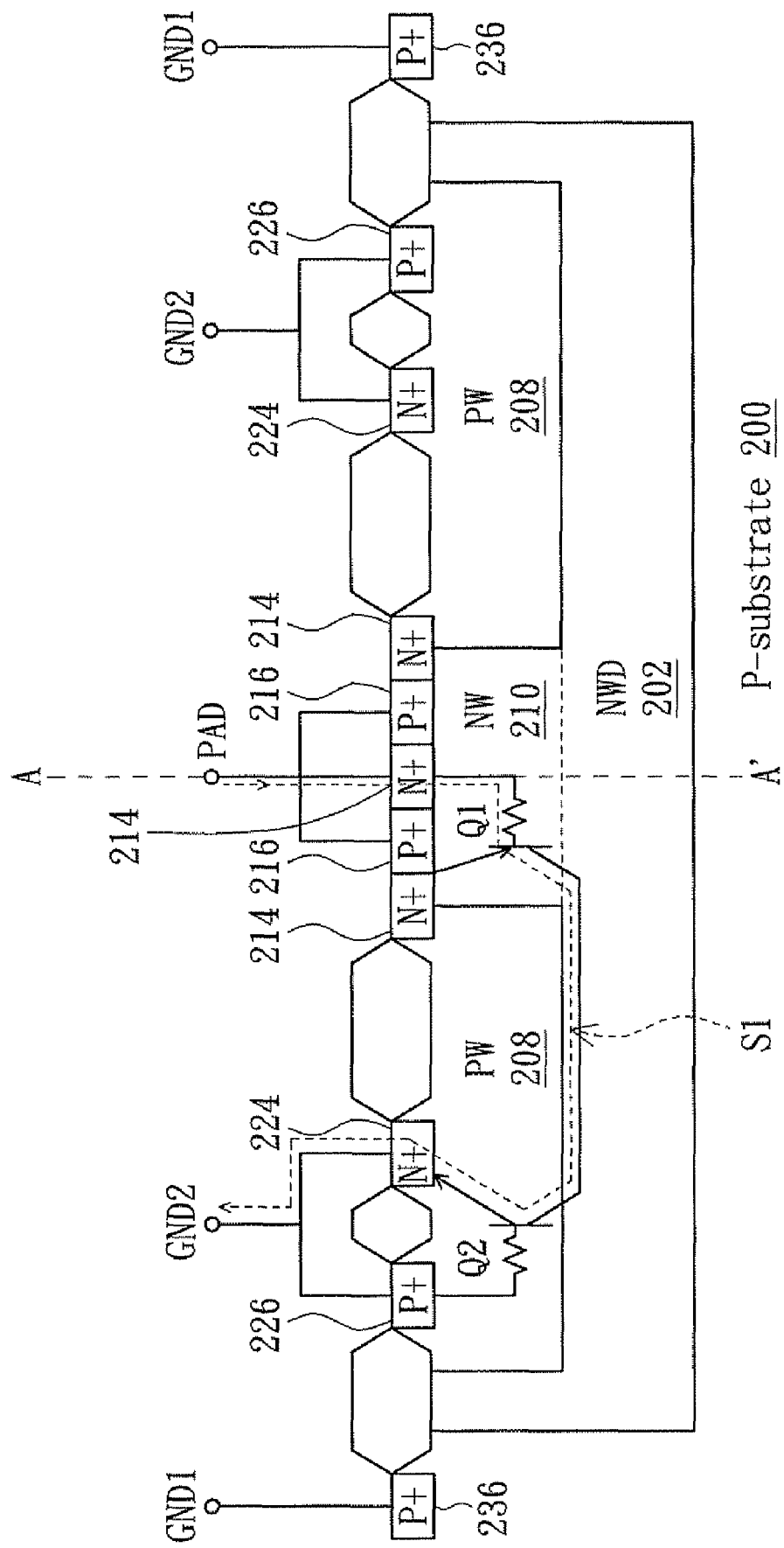
FIG. 2 shows a cross-sectional diagram of a low voltage silicon controlled rectifier ESD protection device according to the first embodiment of the present invention.
Figure 3:
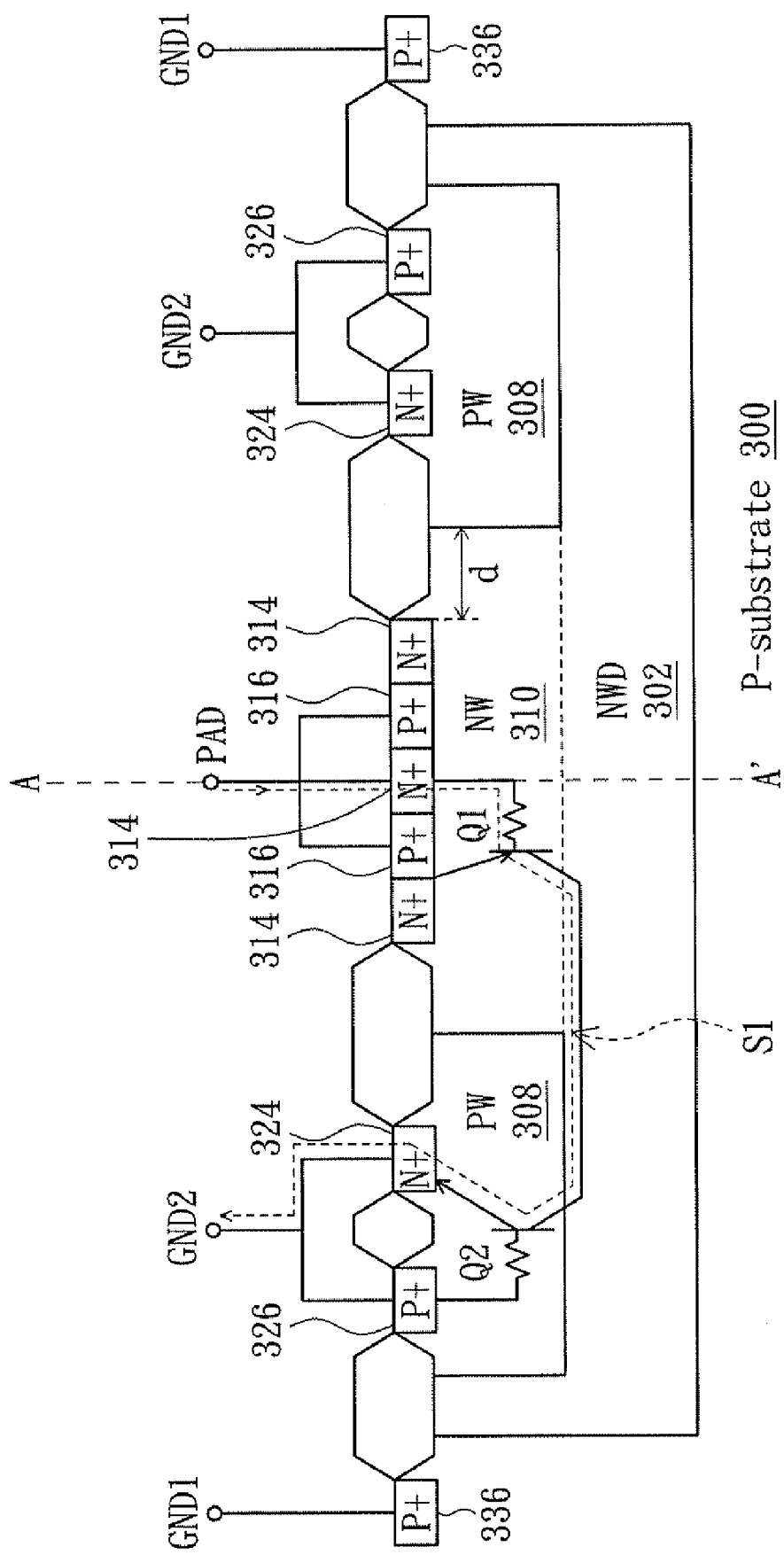
FIG. 3 shows a cross-sectional diagram of a high voltage silicon controlled rectifier ESD protection device according to the first embodiment of the present invention.

In the first embodiment, the semiconductor structures for protecting an internal integrated circuit to improve the electrical characteristics of the ESD protection device are shown. FIG. 2 shows a cross-sectional diagram of a low voltage silicon controlled rectifier ESD protection device according to the first embodiment of the present invention. FIG. 3 shows a cross-sectional diagram of a high voltage silicon controlled rectifier ESD protection device according to the first embodiment of the present invention.

As shown in FIG. 2, the semiconductor structure comprises a P-substrate 200, a plurality of first doping regions, such as a N+ region 214, a P+ region 216, a N+ region 214, a P+ region 216, a N+ region 214 arranged in order, formed in the P-substrate 200 and disposed substantially within an N-well 210. A pad is formed above the P-substrate 200 and electrically connected to at least one of the first doping regions. For example, the pad is electrically connected to the N+ region 214 arranged in middle of line and to P+ region 216 adjacent to the N+ region 214. Besides, two N+ regions 214 are disposed nearby boundaries of the N-well 210. A plurality of second doping regions such as the N+ regions 224 and the P+ regions 226, are formed in the P-substrate 200 and respectively disposed within the P-wells 208. Also, the second doping regions (i.e. the N+ regions 224 and the P+ regions 226) are isolated from the first doping regions (i.e. the N+ regions 214 and the P+ regions 216). The N+ regions 224 within the P-wells 208 are disposed close to the first doping regions. Furthermore, a N+ section is formed in the P-substrate 200 and encloses the N-well 210 and the P-wells 208. In the first embodiment, a deep N-well (NWD) 202 is formed to be the N+ section of the present invention. Accordingly, the first and second doping regions (located within the N+ section) are isolated from the P-substrate 200 by the N+ section (i.e. NWD 202). Moreover, the first grounds (such as GND1) and the second grounds (such as GND2) are respectively disposed at the positions corresponding to outside and inside of the N+ section (i.e. NWD 202), and the second grounds are electrically connected to at least one of the second doping regions.

In FIG. 2, a low voltage silicon controlled rectifier (SCR) device is illustrated as the semiconductor structure of the present invention. It is noted that two N+ regions 214 cross the boundaries of the N-well 210 and are partially disposed in the P-wells 208. It should be noted that the semiconductor structure of FIG. 2 is symmetric to the line A-A', so in the following description, only one side (ex: the left side) of the semiconductor structure is discussed. Because the other side of the semiconductor structure is the same, so the discussion will be omitted. According to the invention, an ESD protection circuit is provided with a SCR circuit S1, consisting of a vertical npn bipolar transistor Q1 and a vertical pnp bipolar transistor Q2 with a common base/collector current.

As shown in FIG. 2, the vertical transistor Q1 has a base region 214, an emitter region 216, and a collector region PW 208. The base region 214 is a surface region doped N+, the emitter region 216 is a surface region doped P+, and the collector region 208 is a P well region. The vertical transistor Q2 has a base region 226, a collector region NWD 202, and an emitter region 224. The base region 226 is a surface region doped P+, the emitter region 224 is a surface region doped N+, and the collector region 202 is a Deep n region (NWD).

In the embodiment, the structure of FIG. 2 with a low breakdown voltage is designed by forming part of the N+ region 214 within the PW regions 208. When an ESD protection circuit is triggered, the latch-up phenomena occurs, and a large current is flowed through the SCR to the GND2.

The semiconductor structure of FIG. 2 also shows a plurality of third doping regions, such as the P+ regions 236, formed in the P-substrate 200 and positioned at the outsides of the N+ section (i.e. NWD 202), wherein the third doping regions are disposed adjacent to the second doping regions (i.e., the P+ regions 226 and N+ regions 224). Furthermore, the first ground (GND1) is electrically connected to at least one of the third doping regions (i.e. the P+ regions 236). Therefore, the semiconductor structure of FIG. 2 demonstrates two grounds, GND1 and GND2, separated by the deep N-well 202 (NWD). In the practical application, GND1 and GND2 could be independently connected to the different circuits (ex: the "dirty" circuit and "clean" circuit) for improving the electrical characteristics of the device. For example, a high voltage ESD protection device and circuits can be connected to the ground GND2, and the low voltage integrated circuits of the internal circuit can be connected to the other ground GND1 which is isolated from GND2. Since there are two independent grounds in the invention, the high voltage parasitic signals connected to GND2 will not cause effect on the low voltage integrated circuits of the internal circuit. Furthermore, since the deep N-well 202 isolates the high voltage ESD protection circuit (connected to GND2) and the low voltage internal circuit (connected to GND1), the semiconductor structure for protecting an internal integrated circuit in FIG. 2 can greatly enhance the isolation function so as to avoid the high voltage parasitic signals in the GND2 to affect the internal circuit.

Second Embodiment

FIG. 3 shows a high voltage silicon controlled rectifier (SCR) ESD protection device according to the first embodiment of the invention. The high voltage SCR ESD protection device of FIG. 3 is almost the same as the low voltage SCR ESD protection device of FIG. 2 except whether the N-section fully encloses the first doping regions. According to FIG. 3, the two N+ regions 314 nearby the boundaries of N-well 310 are disposed within the N-well 310. In this embodiment, the structure of FIG. 3 is designed to possess high breakdown voltage. The larger the distance d (space between the edges of the N+ region 314 and the P-well 308), the higher the breakdown voltage.

As shown in FIG. 3, the semiconductor structure comprises a P-substrate 300, a plurality of first doping regions including N+ regions 314 and P+ regions 316 (arranged in an order of N+P+N+P+N+), formed in the P-substrate 200 and disposed within an N-well 310. It is noted that the N-well 310 of FIG. 3 fully encloses the first doping regions. A pad is electrically connected to the N+ region 314 arranged in middle of line and to the P+ region 316 adjacent to the N+ region 314. A plurality of second doping regions including the N+ regions 324 and the P+ regions 326 are formed in the P-substrate 300 and respectively disposed within the P-wells 308. The second doping regions (i.e. the N+ regions 324 and the P+ regions 326) are isolated from the first doping regions (i.e. the N+ regions 314 and the P+ regions 316). Similar to FIG. 2, a deep N-well (NWD) 302 is formed on the P-substrate 300 to be a N+ section for enclosing the N-well 310 and the P-wells 308. Accordingly, the first and second doping regions are isolated from the P-substrate 300 by the N+ section (i.e. NWD 302). Also, a plurality of third doping regions, such as the P+ regions 336, are formed in the P-substrate 200 and positioned at the outsides of the N+ section (i.e. NWD 302). Moreover, two grounds, GND1 and GND2, separated by the N+ section, are constructed according to the present invention, which means that the first grounds (such as GND1) and the second grounds (such as GND2), are disposed to the positions respectively at the outside and the inside of the N+ section (ex. NWD 302). As shown in FIG. 3, the first ground (GND1) is electrically connected to at least one of the third doping regions (i.e. the P+ regions 336), and the second ground (GND2) is electrically connected to at least one of the second doping regions.

In FIG. 3, a high voltage silicon controlled rectifier (SCR) device is illustrated as the semiconductor structure of the present invention. The difference between the structures of first embodiment (FIG. 2) and second embodiment (FIG. 3) is that the N+ regions 314 are fully enclosed by the N-well 310 and spaced from the P-well 308 at a distance d. Additionally, the semiconductor structure of FIG. 3 is also symmetric to the line A-A', so that the descriptions about one side of the structure are also suitable for describing the other side of the structure. According to the invention, an ESD protection circuit is provided with a SCR circuit S1 at one side of the semiconductor structure, consisting of a vertical npn bipolar transistor Q1 and a vertical pnp bipolar transistor Q2 with a common base/collector current.

As shown in FIG. 3, the vertical transistor Q1 has a base region 314, an emitter region 316, and a collector region PW 308. The base region 314 is a surface region doped N+, the emitter region 316 is a surface region doped P+, and the collector region 308 is a P well region. The vertical transistor Q2 has a base region 326, a collector region NWD 302, and an emitter region 324. The base region 326 is a surface region doped P+, the emitter region 324 is a surface region doped N+, and the collector region 302 is a Deep n region (NWD). When an ESD protection circuit is triggered, the latch-up phenomena occurs, and a large current is flowed through the SCR to the GND2.

Similarly, the semiconductor structure of FIG. 3 demonstrates two grounds, GND1 and GND2, separated by the deep N-well 302 (NWD). In the practical application, GND1 and GND2 could be independently connected to the different circuits (ex: the "dirty" circuit and "clean" circuit) for improving the electrical characteristics of the device. For example, a high voltage ESD protection device and circuits can be connected to the ground GND2, and the low voltage integrated circuits of the internal circuit can be connected to the other ground GND1 which is isolated from GND2. Since there are two independent grounds in the invention, the high voltage parasitic signals connected to GND2 will not cause effect on the low voltage integrated circuits of the internal circuit. Furthermore, since the deep N-well 302 isolates the high voltage ESD protection circuit (connected to GND2) and the low voltage internal circuit (connected to GND1), the semiconductor structure of FIG. 3 for protecting an internal integrated circuit can greatly enhance the isolation function so as to avoid the high voltage parasitic signals in the GND2 to affect the internal circuit.

Third Embodiment

Figure 4:
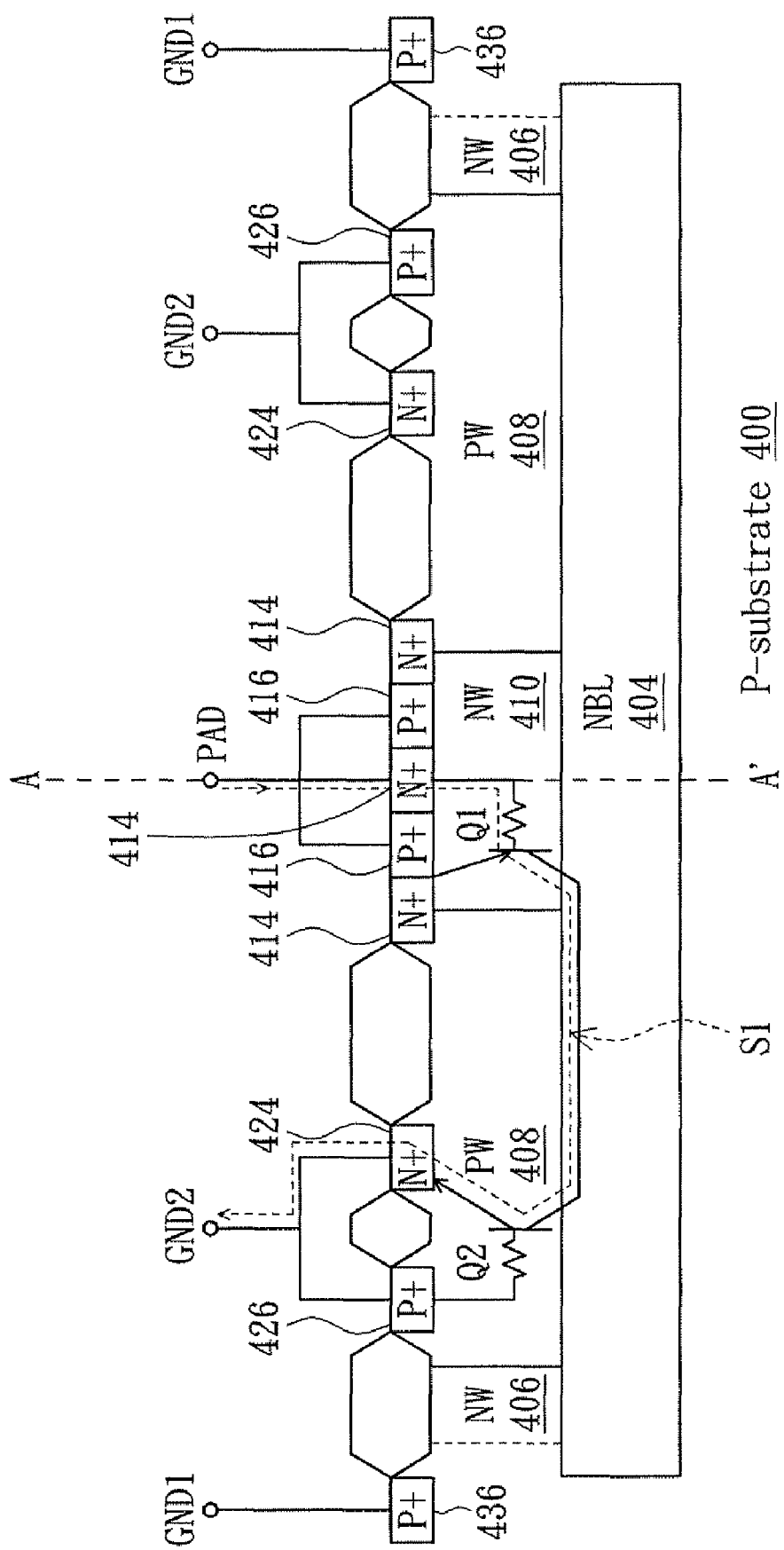
FIG. 4 shows a cross-sectional diagram of a low voltage silicon controlled rectifier ESD protection device according to the second embodiment of the present invention.
Figure 5:
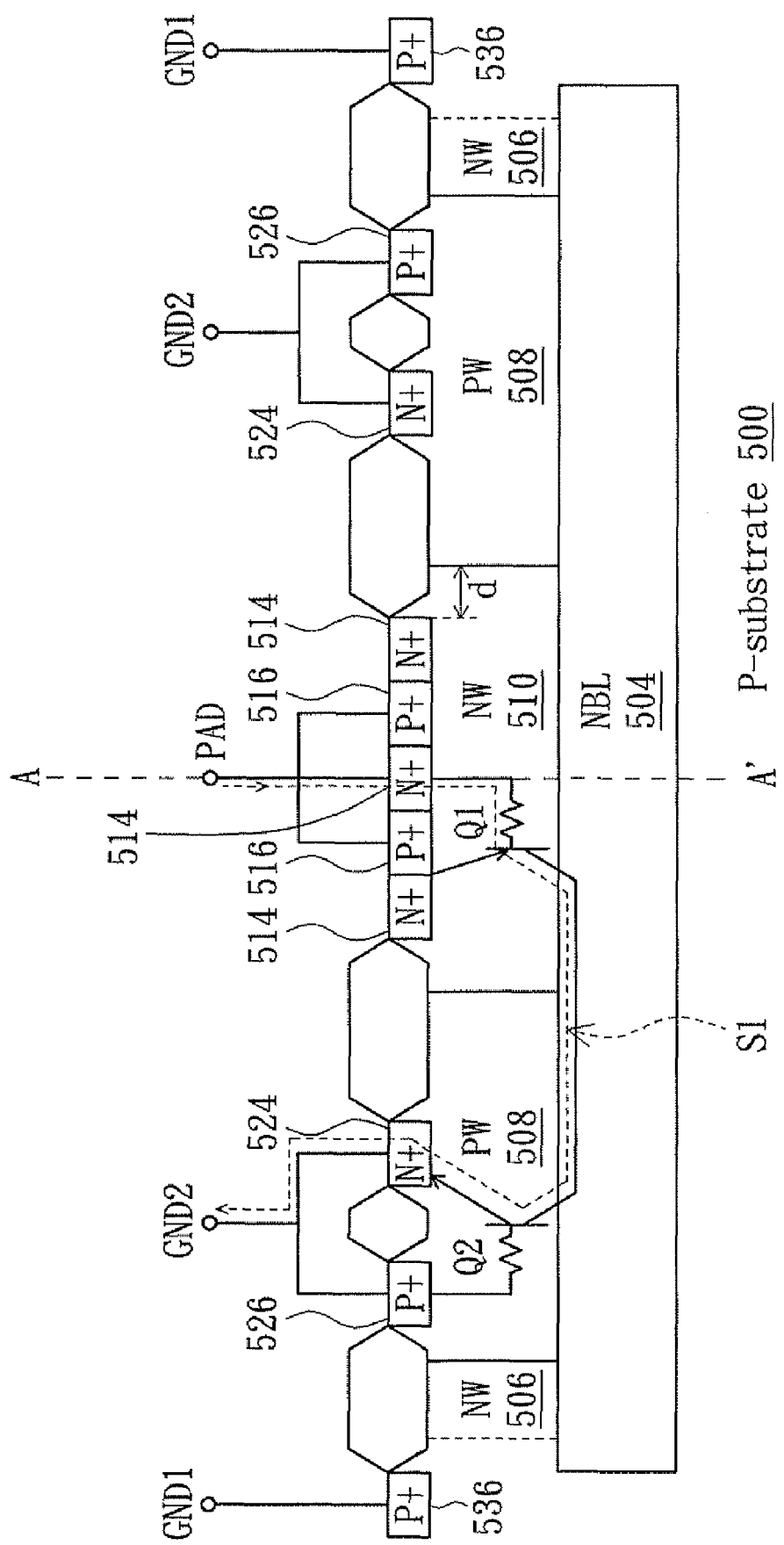
FIG. 5 shows a cross-sectional diagram of a high voltage silicon controlled rectifier ESD protection device according to the second embodiment of the present invention.

In the third embodiment, the formation of the N+ section is different from the first embodiment. However, the semiconductor structures disclosed in this embodiment is also capable of protecting the internal integrated circuit and improving the electrical characteristics of the ESD protection device. FIG. 4 shows a cross-sectional diagram of a low voltage silicon controlled rectifier ESD protection device according to the third embodiment of the present invention. FIG. 5 shows a cross-sectional diagram of a high voltage silicon controlled rectifier ESD protection device according to the third embodiment of the present invention. It is noted that the difference of the structures in FIG. 4 and FIG. 2 is the N+ section for isolating two grounds GND1 and GND2, wherein the N+ section of FIG. 2 is the deep N-well 202 (NWD) and the N+ section of FIG. 4 comprises a N+ buried layer 404 and the N+ channels 406. Similarly, the difference of the structures in FIG. 5 and FIG. 3 is the N+ section for isolating two grounds GND1 and GND2, wherein the N+ section of FIG. 3 is the deep N-well 302 (NWD) and the N+ section of FIG. 5 comprises a N+ buried layer 504 and the N+ channels 506.

As shown in FIG. 4, the semiconductor structure comprises a P-substrate 400, a plurality of first doping regions, such as the N+ regions 414 and the P+ regions 416 arranged in an order of N+P+N+P+N+, formed in the P-substrate 400 and disposed substantially within an N-well 410. A pad is formed above the P-substrate 200 and electrically connected to the first doping regions. For example, the pad is electrically connected to the N+ region 414 arranged in middle of line and to the P+ region 416 adjacent to said N+ region 414. Besides, two N+ regions 414 are disposed nearby boundaries of the N-well 410. A plurality of second doping regions, such as N+ regions 424 and P+ regions 426 are formed in the P-substrate 400 and respectively disposed within the P-wells 408. Also, the second doping regions are isolated from the first doping regions. The N+ regions 424 within the P-wells 408 are disposed close to the first doping regions. Furthermore, a N+ section, is formed in the P-substrate 400 for enclosing the N-well 410 and the P-wells 408, isolated by a FOX (Field Oxide) to each other. In the third embodiment, the N+ section comprises a N+ buried layer 404 and the N+ channels 406. The N+ channel 406 could be a N-well or N+ Sinker, which is formed in the P-substrate 400 and disposed adjacent to the P-well 408. The N+ channels 406 are connected to the N+ buried layer 404, wherein the N+ channels 406 and the N+ buried layer 404 are structurally integrated as a cap for enclosing the N-well 410 and the P-wells 408.

Similarly, the first and second doping regions located within the N+ section (i.e. the N+ buried layer 404 plus the N+ channels 406) are isolated from the P-substrate 400 by the N+ section. Finally, the first grounds (GND1) and the second grounds (GND2) are respectively disposed at the positions corresponding to outside and inside of the N+ section, and the second grounds (GND2) are electrically connected to at least one of the second doping regions. It is also noted that two N+ regions 414 cross the boundaries of the N-well 410 and are partially disposed in the P-wells 408 according to the low voltage SCR device shown in FIG. 4. The semiconductor structure of FIG. 4 also shows a plurality of third doping regions, such as the P+ regions 436, formed in the P-substrate 400 and positioned at the outsides of the N+ section. In FIG. 5, shows a high voltage silicon controlled rectifier (SCR) ESD protection device according to the second embodiment of the invention. It is almost the same as the low voltage silicon controlled rectifier (SCR) ESD protection device of FIG. 4 except whether the N-section fully encloses the first doping regions. According to FIG. 5, two N+ regions 514 nearby boundaries of the N-well 510 are disposed within the N-well 510.

As shown in FIG. 5, the semiconductor structure comprises a P-substrate 500, a plurality of first doping regions (including N+ regions 514 and P+ regions 516 arranged in an order of N+P+N+P+N+) disposed within an N-well 510. It is noted that the N-well 510 of FIG. 5 fully encloses the first doping regions. A pad is electrically connected to a N+ region 514 arranged and to a P+ region 516 adjacent to the N+ region 314. A plurality of second doping regions including the N+ regions 524 and the P+ regions 526 are formed in the P-substrate 500 and respectively disposed within the P-wells 508. The second doping regions are isolated from the first doping regions. Similar to FIG. 4, a N+ buried layer (NBL) 504 and the N+ channels 506 are formed on the P-substrate 500 to be a N+ section for enclosing the N-well 510 and the P-wells 508. Accordingly, the first and second doping regions are isolated from the P-substrate 500 by the N+ section. Also, two grounds, GND1 and GND2, separated by the N+ section, are constructed, wherein the by electrically connected Also, a plurality of third doping regions, such as the P+ regions 536, are formed in the P-substrate 500 and positioned at the outsides of the N+ section.

Furthermore, both of FIG. 4 and FIG. 5 show that the first ground (GND1) is electrically connected to at least one of the third doping regions (i.e. the P+ regions 436), and the second ground (GND2) is electrically connected to at least one of the second doping regions (i.e. the N+ regions 414 and the P+ regions 416). Therefore, the semiconductor structures of FIG. 4 and FIG. 5 demonstrate two grounds, GND1 and GND2 separated by the N+ section (i.e. the N+ buried layer 404 plus the N+ channels 406).

FIG. 4 illustrates a low voltage silicon controlled rectifier (SCR) device as the semiconductor structure of the present invention, while FIG. 5 illustrates a high voltage silicon controlled rectifier (SCR) device as the semiconductor structure of the present invention. The difference between the structures of FIG. 4 and FIG. 5 is that the N+ regions 514 are fully enclosed by the N-well 510 and spaced from the P-well 508 at a distance d. Additionally, both FIG. 4 and FIG. 5 present the symmetric structures with the symmetric lines A-A'. Since the structures of FIG. 4 and FIG. 5 are symmetric, the descriptions about one side of the structure are also suitable for describing the other side of the structure. According to the invention, an ESD protection circuit is provided with a SCR circuit S1 at one side of the semiconductor structure, consisting of a vertical npn bipolar transistor Q1 and a vertical pnp bipolar transistor Q2 with a common base/collector current.

As shown in FIG. 4, the vertical transistor Q1 has a base region 414 (a surface region doped N+), an emitter region 416 (a surface region doped P+), and a collector region PW 408 (P well region). The vertical transistor Q2 has a base region 426 (a surface region doped P+), a collector region NBL 404 (a buried N+ layer), and an emitter region 424 (a surface region doped N+). When an ESD protection circuit is triggered, the latch-up phenomena occurs, and a large current is flowed through the SCR to the GND2.

As shown in FIG. 5, the vertical transistor Q1 has a base region 514 (a surface region doped N+), an emitter region 516 (a surface region doped P+), and a collector region PW 508 (P well region). The vertical transistor Q2 has a base region 526 (a surface region doped P+), a collector region NBL 504 (a buried N+ layer), and an emitter region 524 (a surface region doped N+). When an ESD protection circuit is triggered, the latch-up phenomena occurs, and a large current is flowed through the SCR to the GND2.

Similarly, the semiconductor structures of FIGS. 4 and 5 demonstrate two grounds, GND1 and GND2, separated by the N+ section (NBL+NW). In the practical application, GND1 and GND2 could be independently connected to the different circuits (ex: the "dirty" circuit and "clean" circuit) for improving the electrical characteristics of the device (as described in the first and second embodiments).

Figure 6:
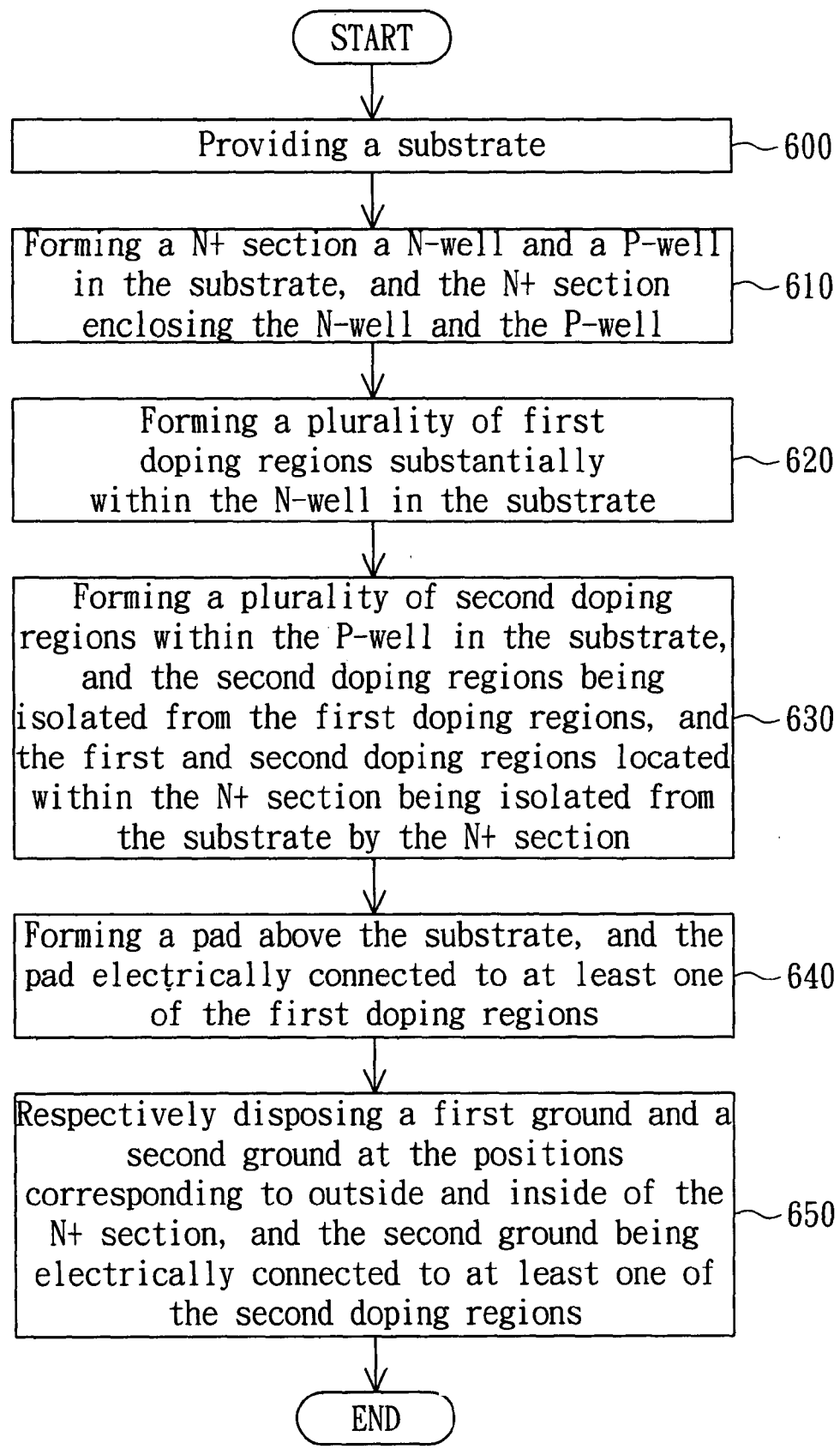
FIG. 6 is a flow chart of the method for manufacturing a semiconductor structure for protecting an internal integrated circuit.

FIG. 6 is a flow chart of a method for manufacturing the semiconductor structure for protecting an internal integrated circuit according to the present invention. First, in step 600, an ion-doped substrate, such as a P-type substrate, is provided. Next, in step 610, a N+ section, a N-well and a P-well are formed in the substrate, wherein the step of forming a N+ section is performed before enclosing the N-well and the P-well. Formation of the N+ section could be performed by forming a deep N-well (NWD, as shown in FIG. 2 and FIG. 3) or constructing a cap with a N+ buried layer (NBL) plus the N+ channels (FIG. 4 and FIG. 5) in the substrate to enclose the N-well and the P-wells. Next, in step 620, several first doping regions (arranged in an order of N+, P+, N+, P+ and N+ regions) are formed substantially within the N-well in the substrate, wherein two N+ regions are disposed nearby boundaries of the N-well. In the application of low voltage SCR ESD device, two N+ regions of the first doping regions cross the boundaries of the N-well (210/410) as shown in FIG. 2 and FIG. 4. In the application of high voltage SCR ESD device, the N-well (310/510) fully encloses the first doping regions as shown in FIG. 3 and FIG. 5. Next, in step 630, a plurality of second doping regions are formed within the P-wells in the substrate, and the second doping regions are isolated from the first doping regions. Also, the first and second doping regions are isolated from the substrate by the N+ section. The method for manufacturing a semiconductor structure further comprises forming a plurality of third doping regions adjacent to the second doping regions in the substrate and outside the N+ section. Next, in step 640, a pad is formed above the substrate, by electrically connecting to at least one of the first doping regions. As illustrated in the embodiments, the pad is electrically connected to a N+ region arranged in middle of line and to a P+ region adjacent to said N+ region. Then, in the step 650, at least a first ground and a second ground are formed at the positions respectively corresponding to outside and inside of the N+ section, wherein the second ground is electrically connected to at least one of the second doping regions.

While the invention has been described by way of example and in terms of the preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure for protecting an internal integrated circuit, comprising:
   a substrate;
   a plurality of first doping regions, formed in the substrate and disposed substantially within an N-well;
   a plurality of second doping regions, formed in the substrate and disposed within a P-well, the second doping regions being isolated from the first doping regions;

a N+ section, formed in the substrate and enclosing the N-well and the P-well, wherein the first and second doping regions located within the N+ section are isolated from the substrate by the N+ section;

a pad, formed above the substrate and electrically connected to at least one of the first doping regions;

a first ground and a second ground, respectively disposed to positions corresponding to outside and inside of the N+ section, the first ground electrically connected to the internal integrated circuit and the second ground electrically connected to at least one of the second doping regions, wherein the first ground is isolated from the second ground.

2. The semiconductor structure according to claim 1, further comprising a plurality of third doping regions formed in the substrate and outside the N+ section, wherein the third doping regions are disposed adjacent to the second doping regions.

3. The semiconductor structure according to claim 2, wherein the first ground is electrically connected to at least one of the third doping regions.

4. The semiconductor structure according to claim 1, wherein the first doping regions comprise a plurality of N+ regions and P+ regions, and two N+ regions are-disposed nearby boundaries of the N-well.

5. The semiconductor structure according to claim 4, wherein the first doping regions are N+, P+, N+, P+, N+ regions arranged in order.

6. The semiconductor structure according to claim 5, wherein the second doping regions within the P-well comprise a N+ region and a P+ region, and the N+ region is disposed close to the first doping regions.

7. The semiconductor structure according to claim 5, wherein the pad is electrically connected to the N+ region arranged in the middle of the first doping regions and electrically connected to the P+ regions adjacent to said N+ region in the middle.

8. The semiconductor structure according to claim 4, wherein the two N+ regions nearby boundaries of N-well are disposed within the N-well.

9. The semiconductor structure according to claim 4, wherein the two N+ regions nearby boundaries of the N-well are located across boundaries of the N-well and partially disposed in the P-well.

10. The semiconductor structure according to claim 1, wherein the N+ section is a deep N-well for enclosing the N-well and the P-well.

11. The semiconductor structure according to claim 1, wherein the N+ section comprises:

a N+ buried layer, formed in the substrate and disposed adjacent to the P-well, and the N+ channel connected to the N+ buried layer;

wherein the N+ channel and the N+ buried layer are integrated as a cap for enclosing the N-well and the P-well.

12. The semiconductor structure according to claim 11, wherein the N+ layer is a N-well.

13. The semiconductor structure according to claim 1, wherein the substrate is a p-type substrate.

* * * * *